United States Patent
Di Piro et al.

(10) Patent No.: US 11,940,402 B2
(45) Date of Patent: Mar. 26, 2024

(54) CIRCUIT ARRANGEMENT AND SENSOR ARRANGEMENTS INCLUDING THE SAME

(71) Applicant: Sciosense B.V., AE Eindhoven (NL)

(72) Inventors: Luigi Di Piro, Eindhoven (NL); Giuseppe Pasetti, Eindhoven (NL); Monica Schipani, Eindhoven (NL)

(73) Assignee: Sciosense B.V., AE Eindhoven (NL)

( * ) Notice: Subject to any disclaimer, the term of this patent is extended or adjusted under 35 U.S.C. 154(b) by 439 days.

(21) Appl. No.: 17/278,740

(22) PCT Filed: Sep. 25, 2019

(86) PCT No.: PCT/EP2019/075896
§ 371 (c)(1),
(2) Date: Mar. 23, 2021

(87) PCT Pub. No.: WO2020/064854
PCT Pub. Date: Apr. 2, 2020

(65) Prior Publication Data
US 2022/0034834 A1    Feb. 3, 2022

(30) Foreign Application Priority Data
Sep. 25, 2018   (EP) ..................... 18196597

(51) Int. Cl.
*G01N 27/12* (2006.01)
*G01K 7/20* (2006.01)
(Continued)

(52) U.S. Cl.
CPC ............. *G01N 27/122* (2013.01); *G01K 7/20* (2013.01); *H03K 17/60* (2013.01); *H03K 17/6871* (2013.01)

(58) Field of Classification Search
CPC .......... G01N 27/122; G01K 7/20; G01K 7/21; G01K 7/25; H03K 17/60; H03K 17/6871; H03K 17/94
See application file for complete search history.

(56) References Cited

U.S. PATENT DOCUMENTS 4,004,462 A   1/1977  Dobkin
5,453,682 A   9/1995  Hinrichs et al.
(Continued)

FOREIGN PATENT DOCUMENTS

DE   2522437 A1   12/1975
EP   2921850 A1   9/2015
(Continued)

OTHER PUBLICATIONS

Barrettino et al., "CMOS Monolithic Metal-Oxide Gas Sensor Microsystems", IEEE Sensors Journal, vol. 6, No. 2, Apr. 2006, 11 pages.
(Continued)

*Primary Examiner* — Freddie Kirkland, III
(74) *Attorney, Agent, or Firm* — Slater Matsil, LLP

(57) ABSTRACT

A circuit arrangement comprises a first branch comprising a resistor of variable resistance and a diode-connected bipolar transistor and a second branch comprising a resistor of fixed resistance and another diode-connected bipolar transistor. A control loop reproduces a voltage drop at the resistor of variable resistance to a voltage drop at the resistor of fixed resistance. Output terminals are connected to the bipolar transistors to supply a differential voltage. The circuit arrangement may be used as an analog frontend circuit in a gas sensor or a temperature sensor arrangement.

16 Claims, 6 Drawing Sheets

(51) Int. Cl.
*H03K 17/60* (2006.01)
*H03K 17/687* (2006.01)

(56) References Cited

U.S. PATENT DOCUMENTS

| | | | |
|---|---|---|---|
| 6,995,588 B2* | 2/2006 | Gee | G01K 7/01 327/83 |
| 7,126,509 B2 | 10/2006 | Sit et al. | |
| 11,199,516 B2* | 12/2021 | Ranganathan | G01N 27/122 |
| 2006/0153277 A1 | 7/2006 | Yoshida | |
| 2014/0340100 A1 | 11/2014 | Popa et al. | |
| 2016/0209854 A1 | 7/2016 | Yen et al. | |
| 2020/0033284 A1* | 1/2020 | Ranganathan | G01N 27/122 |

FOREIGN PATENT DOCUMENTS

| | | |
|---|---|---|
| EP | 3301437 A1 | 4/2018 |
| EP | 3546956 A1 | 10/2019 |
| JP | 2004312110 A | 11/2004 |
| JP | 2005156251 A | 6/2005 |

OTHER PUBLICATIONS

Gardner et al., "CMOS Interfacing for Integrated Gas Sensors: A Review", IEEE Sensors Journal, vol. 10, No. 12, Dec. 2010, 16 opages.
Graf et al., "CMOS Hotplate Chemical Microsensors", Springer Verlag; Edition Microtechnology and MEMS, Apr. 2007, 131 pages.
International Search Report and Written Opinion in corresponding International Application No. PCT/EP2019/075896 dated Nov. 27, 2019, 11 pages.

* cited by examiner

CIRCUIT ARRANGEMENT AND SENSOR ARRANGEMENTS INCLUDING THE SAME

CROSS-REFERENCE TO RELATED APPLICATIONS

The present application is a national stage entry of International Patent Application No. PCT/EP2019/075896, filed on Sep. 25, 2019, which claims benefit of priority of European Patent Application No. 18196597.1 filed on Sep. 25, 2018, all of which are hereby incorporated by reference in their entirety for all purposes.

TECHNICAL FIELD

The present disclosure relates to a circuit arrangement to generate a differential voltage. Specifically, the present disclosure relates to a circuit arrangement that includes a first and a second branch including resistors of variable and fixed resistance and bipolar transistors. The present disclosure also relates to a gas sensor arrangement and a temperature sensor arrangement that include such a circuit arrangement.

BACKGROUND

Electronic sensors such as gas sensors and temperature sensors often include the measurement of the resistance of a variable resistor of which the resistance depends on the concentration of a gas or the temperature, respectively. The sensors may use a logarithmic compression technique to cover a wide measurement range. The analog frontend circuits included in these sensors may comprise a circuit branch including the resistor of variable resistance and another circuit branch with a resistor of fixed resistance serving as a reference. A differential voltage generated by the branches may be analog-to-digital converted and further processed to output a digital value in dependence on the resistance of the resistor of variable resistance that represents the sensed physical characteristic.

Conventional frontend circuits for the field of resistance measurement for resistive sensors such as gas sensors or temperature sensors may include two branches with variable and fixed resistors. The logarithmic compression technique uses the current-to-voltage dependence of bipolar diodes included in the branches. Each of the two branches includes a control loop to generate a predetermined voltage at the resistors. The control loops operate substantially independent from each other. Due to logarithmic compression, the resistive sensors may operate with currents varying in a wide range that leads to several challenges such as mismatch of the sensitive and reference branches, large devices that have to also work with very low currents, capacitive loads on the sensor pins that may affect testability, area and power consumption issues, leakage current issues and weakness in the case of short-circuiting of the sensor pins.

SUMMARY

According to an embodiment, a circuit arrangement includes a first branch including a resistor of variable resistance and a diode-connected bipolar transistor both connected between a supply potential terminal and a ground potential terminal. A second branch includes a resistor of fixed resistance and a diode connected other bipolar transistor, the resistor of fixed resistance connected to the resistor of the first branch and the bipolar transistor connected to the ground potential terminal. The circuit arrangement may be used as a frontend circuit for wide range resistance measurement using logarithmic compression.

A control loop is provided to measure a voltage drop at the resistor of variable resistance of the first branch and reproduce this voltage drop to a voltage drop at the resistor of fixed resistance of the second branch. The control loop transfers a signal such as the voltage drop at the resistor of variable resistance from the first branch to the second branch and reproduces this voltage drop at the resistor of fixed resistance. Only one single control loop is necessary. The control loop ensures that voltage information from the first branch is transferred to the second branch so that the current in the second branch is regulated in response to voltage information from the first branch. This limits the power consumption in exceptional situations, for example, when the sensor resistance is low, or makes the minimum current higher, for example, when the sensor resistance is high which reduces the sensitivity to leakage currents.

Since excessive high currents and excessive low currents are avoided, the components of the circuit arrangement can have moderate sizes, leading to reduced area occupation of the integrated semiconductor chip that realizes the circuit arrangement. The reduced size of the components allows to operate with reduced currents and increases the robustness of the circuit in the case of a short circuit of the sensor terminals. Since large components and very low currents in the circuit arrangement are avoided, design risks can be reduced due to a predictable simulation of the circuit. Any subthreshold operational ranges are avoided. The matching between the first, sensitive and the second, reference branches is relatively good due to comparable sizes of the components.

Output terminals are connected to the bipolar transistors of the first and second branches. The output terminals supply a differential voltage that can be further evaluated by post-processing circuitry to generate a digital value that represents the actual resistance of the variable sensor resistor of the first branch. The relation between voltages and currents at the bipolar transistors is logarithmic so that also the relation between the differential voltage and the resistors is logarithmic so that the range of resistance values is logarithmically compressed. Stated otherwise, the relation between the resistor of variable resistance and the differential voltage is exponential.

According to an embodiment, the control loop comprises an amplifier of which the input terminals are connected to the resistors of the first and second branches to compare the voltage drops at said resistors and generate an output signal to control a transistor disposed in the second, reference branch. The transistor controls the current in the second branch in dependence on the output signal of the amplifier to ensure that the voltage drop at the sensor resistor and at the reference resistor have a predetermined relation or are made equal. A voltage shifter is disposed in the first branch to ensure sufficient voltage drop for the control loop across the amplifier and the transistor of the second branch to ensure proper operation of the voltage control loop.

According to embodiments, a current limiter may be provided in the first branch to limit the current in the circuit arrangement and avoid excessive current in the case of critical situations such as a short-circuit of the sensor pins.

According to a first embodiment, the current limiter can be connected between the resistor of variable resistance and the supply potential terminal. The resistor of fixed resistance of the second branch is connected to the node between the resistor of variable resistance of the first branch and the current limiter. In this case, the current limiter limits the current through the first and second branches.

According to a second embodiment, the current limiter may be connected between the voltage shifter and the diode-connected bipolar transistor of the first branch. The resistor of fixed resistance of the second branch is connected to the node between the resistor of variable resistance of the first branch and the supply potential terminal. In this case, the current limiter limits the current through the first branch. The control loop ensures that the current through the second branch is also limited by regulation.

According to embodiments, the current limiter may comprise a current mirror having an input branch and an output branch. The input branch includes a current source and the output branch is included in the first branch of the circuit arrangement. According to the first embodiment, the output branch is connected between the supply potential terminal and the resistor of variable resistance of the first branch. The output branch limits the current through the first and second branches of the circuit arrangement to a current determined by the current source. According to the second embodiment, the output branch of the current mirror is connected between the diode-connected bipolar transistor of the first branch of the circuit arrangement and the voltage shifter. In this case, the output branch limits the current through the first branch of the circuit arrangement to a current determined by the current source. In any of the first and second embodiments, the current mirror may comprise MOS transistors. The input branch of the current mirror includes a MOS transistor having gate and drain terminals connected together. The output branch of the current mirror comprises the drain-source path of another MOS transistor. Implementation of the current limiter with a current mirror can be achieved with little effort.

According to an embodiment, the voltage shifter comprises a MOS transistor of which the drain-source path is connected to the first branch. The drain-source path of the MOS transistor of the voltage shifter is comprised in the first branch connected to the sensor resistor and to the bipolar transistor of the first branch or to the current limiter depending on the current limiter embodiment. The gate terminal of the MOS transistor of the voltage shifter is connected to a voltage source. The voltage source may be a constant voltage source that may include a bandgap device to generate a temperature-independent constant voltage. The voltage source may also include a dynamic constant voltage source that generates a substantially constant voltage, however, reflecting working conditions of the circuit and providing rough adjustment of the output voltage of the voltage source to optimize operation of the circuit in dependence on operational states of the circuit. The MOS transistor of the voltage shifter may comprise a p-channel MOS transistor so that the source terminal of the MOS transistor supplies a substantially constant voltage to the resistor of variable resistance and to the input terminal of the amplifier of the control loop.

According to an embodiment, the analog differential voltage obtained from the base terminals of the bipolar transistors of the first and second branches can be converted to the digital domain to a digital value that represents the analog differential voltage. An analog-to-digital converter may be connected downstream of the output terminals of the circuit arrangement to generate a digital value. Any type of analog-to-digital converter is useful for circuits of the present disclosure. Specifically, an analog-to-digital converter employing an integrating modulator such as a sigma-delta analog-to-digital converter may be used in circuits according to the present disclosure to generate a bitstream that represents the digital value.

According to an embodiment, a calculator may be provided downstream of the analog-to-digital converter to generate a digital value that is representative of the resistance of the sensor resistor. The digital value is available for further processing, evaluation and control of electronic equipment in dependence on the measured resistance of the sensor resistor. The calculation may use the formula:

$$R_{SENSOR} = R_{REF} \cdot \exp\left(\frac{\Delta V_{BE}}{\frac{KT}{q}\eta}\right)$$

The formula generates a digital value for $R_{SENSOR}$ measuring the differential voltage $\Delta V_{BE}$ and using the term $KT/q \; \eta$. The term includes the temperature T which may be measured through another device in the system and supplied to the calculator. The term $\eta$ represents the ideality factor of the bipolar transistors. It may be assumed that the value $\eta$ is similar or equal for the bipolar transistors of the first and second branches as they are realized on the same integrated circuit. The term K represents the Boltzmann constant and q represents the electron charge. The term $R_{REF}$ represents the resistance value of the resistor of fixed resistance in the second branch. The resistance value $R_{SENSOR}$ of the resistor of variable resistance may depend from an ambient condition such as the concentration of a gas or the temperature so that a relation between the resistance value $R_{SENSOR}$ and the physical entity measured may be drawn in the calculator.

One or more of the above-mentioned objectives is achieved by a gas sensor arrangement according to the features of present claim 13.

The resistor of variable resistance may comprise a gas sensitive resistor. The resistor may change the resistance value in dependence on the concentration of a reactive gas.

According to embodiments, the gas-sensitive resistor may comprise a metal oxide resistor sheet that disposed on a heating element to keep the metal oxide resistor sheet at a predetermined temperature and provide a determined working point. Molecules of a reactive gas may interact with the heated metal oxide sheet in that the generation of electric charges causes a change of the ohmic resistance of the sheet. The interaction may be a chemical reaction such as an oxidation or a reduction. Other working principles of the resistive gas sensor arrangement are also possible.

One or more of the above-mentioned objects are achieved by a temperature sensor arrangement according to the features of present claim 15.

The resistor of variable resistance may comprise a temperature-sensitive resistor of which the resistance depends on temperature. The temperature-sensitive resistor may be a PTC (positive temperature coefficient) or NTC (negative temperature coefficient) type resistor. The layer stack of the resistor is determined such that it changes resistance with changing temperature.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
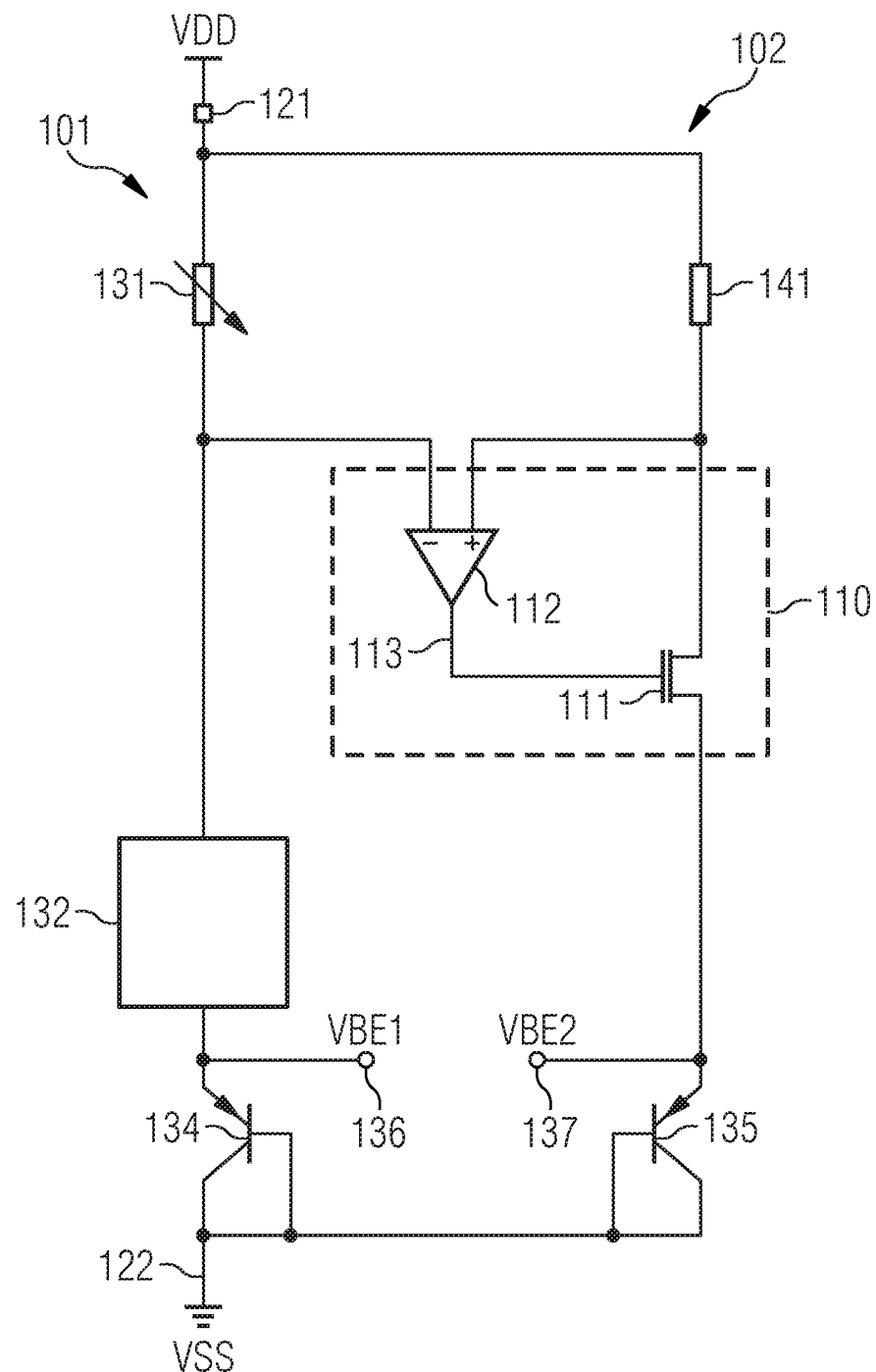
FIG. 1 shows a principle block diagram of a circuit arrangement according to the principles of the present disclosure.

FIG. 1 illustrates a principle block diagram of a circuit arrangement according to the principles of the present disclosure. The circuit arrangement comprises a first branch 101 and a second branch 102. The first branch 101 includes a resistor 131 of variable resistance. The resistance of resistor 131 may depend on ambient conditions such as a gas concentration or ambient temperature or other conditions. The resistor 131 may be used to sense these ambient conditions such as gas concentration or temperature. The resistor 131 is connected to terminal 121 which is supplied by a positive supply potential VDD. The first branch 101 further includes a bipolar transistor 134 of which the base and collector terminals are connected to each other so that transistor 134 forms a diode. The collector and base terminals of transistor 134 are connected to a terminal 122 for ground potential VSS. The second circuit branch 102 includes a resistor 141 having a fixed resistance. Second circuit branch 102 further includes a bipolar transistor 135 connected as a diode and connected to ground terminal 122. The resistor 141 is connected to the variable resistance 131 and, in the embodiment of FIG. 1, to the supply terminal 121.

A control loop 110 is connected to resistors 131, 141 to measure the voltage at variable resistor 131 and duplicate that voltage at resistor 141. The control loop 110 controls the current within the second circuit branch 102 to achieve that the voltage drops at resistors 131, 141 are equal. Control loop 110 includes a first input connected to the resistor 141 and a second input connected to the resistor 141 and corresponding means to control the current through resistor 141 to achieve the same potentials at its input terminals so that the voltage drops across resistors 131 and 141 are driven to the same size. In more detail, control loop 110 includes an amplifier 112 of which one input is connected to variable resistor 131 and of which another input is connected to fixed resistor 141. An output 113 of the error amplifier 112 controls a transistor 111 of which the drain-source path is included in the second branch 102. Transistor 111 is controlled such that the difference between the voltages at the inputs of the error amplifier 112, that is the voltages at variable and fixed resistors 131, 141, becomes substantially zero. Transistor 111 may be a p-channel MOS transistor or an n-channel MOS transistor. The n-channel MOS transistor 111 has gain itself, wherein the p-channel MOS transistor has less gain so that the error amplifier 112 should exhibit sufficient gain to perform the regulating function. In case of a n-channel MOS transistor, the negative input of amplifier 112 is connected to variable resistor 131 and the positive input of amplifier 112 is connected to fixed resistor 141. In case of a p-channel MOS transistor, the connections of the negative and positive inputs of amplifier 112 are to be swapped.

The first branch 101 furthermore includes a voltage shifter 132 which is connected between the variable resistor 131 and the bipolar transistor 134. The negative input of the error amplifier 112 is connected to the node between variable resistor 131 and voltage shifter 132. The voltage shifter 132 ensures that sufficient voltage drops along the path of the error amplifier 112 and the control transistor 111 so that the control loop 110 is operable.

The emitter of bipolar transistor 134 is connected to an output terminal 136 and the emitter of bipolar 135 is connected to an output terminal 137. The terminals 136, 137 supply the base emitter voltages VBE1, VBE2 of the transistors 134, 135 relative to ground potential 122. The differential voltage $\Delta V_{BE}$=VBE1−VBE2 depends on the difference of the currents through the first and second branches 101, 102. Thus, the differential voltage $\Delta V_{BE}$ depends on the resistance of variable resistor 131. The circuit shown in FIG. 1 may be used as an analog frontend circuit in a sensor arrangement.

Figure 2:
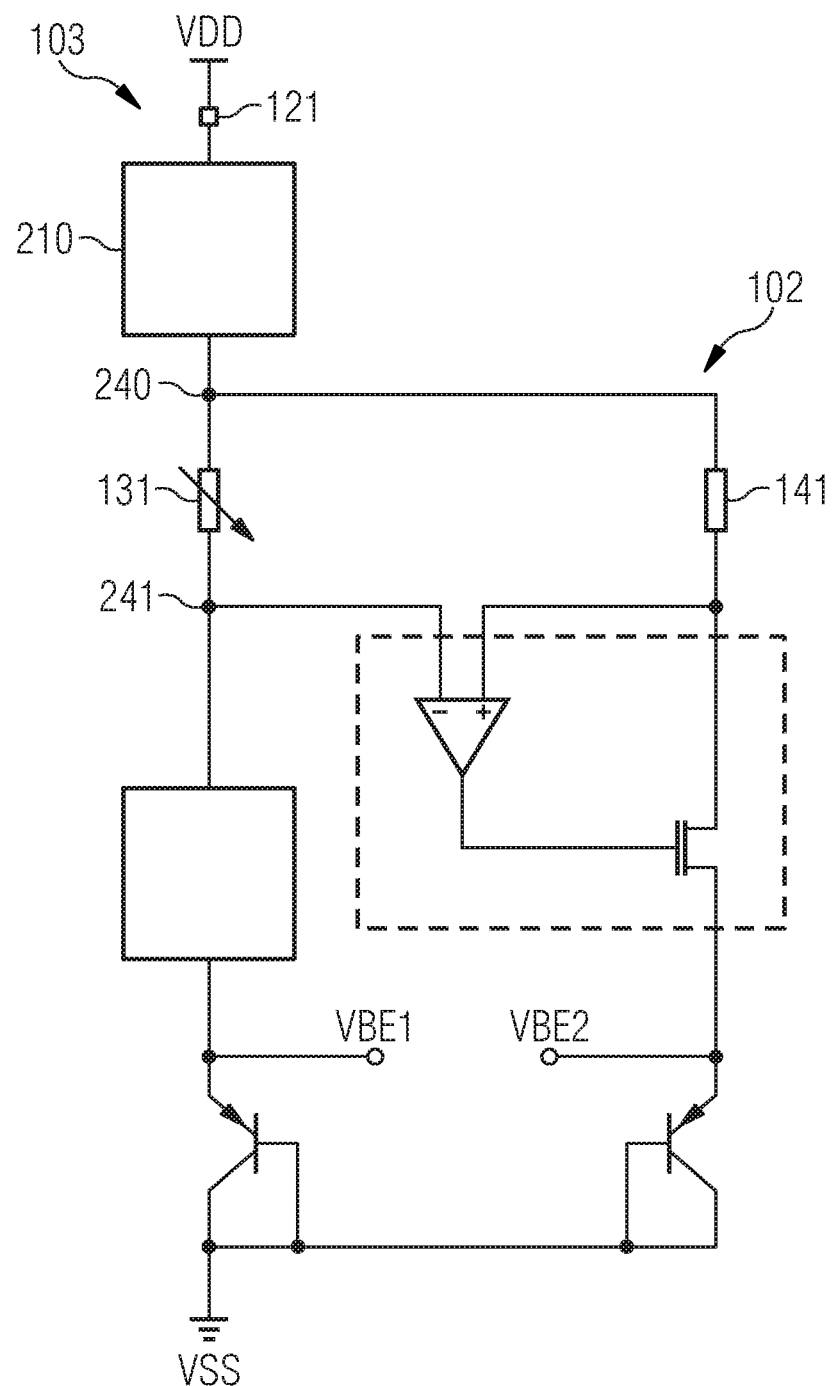
FIG. 2 shows a block diagram of a circuit arrangement according to a first embodiment.

Turning now to FIG. 2, a current limiter block 210 is provided to limit the current flow through the circuit. The current limiter 210 is included in the first circuit branch 103. The current limiter 210 is connected between the variable resistor 131 and terminal 121 for supply potential VDD. The second circuit branch 102 is connected to the node 240 between current limiter 210 and variable resistor 131. In this case, the current limiter 210 limits the current through both circuit branches 103, 102. The current limiter 210 limits the maximum current that is allowed to flow through the first and second branches. This avoids a too excessive current in the case of a very low resistance of variable resistor 131 or in the case of a short circuit between the nodes 240, 241 that may be the sensor pins accessible to the exterior of the circuit.

Figure 3:
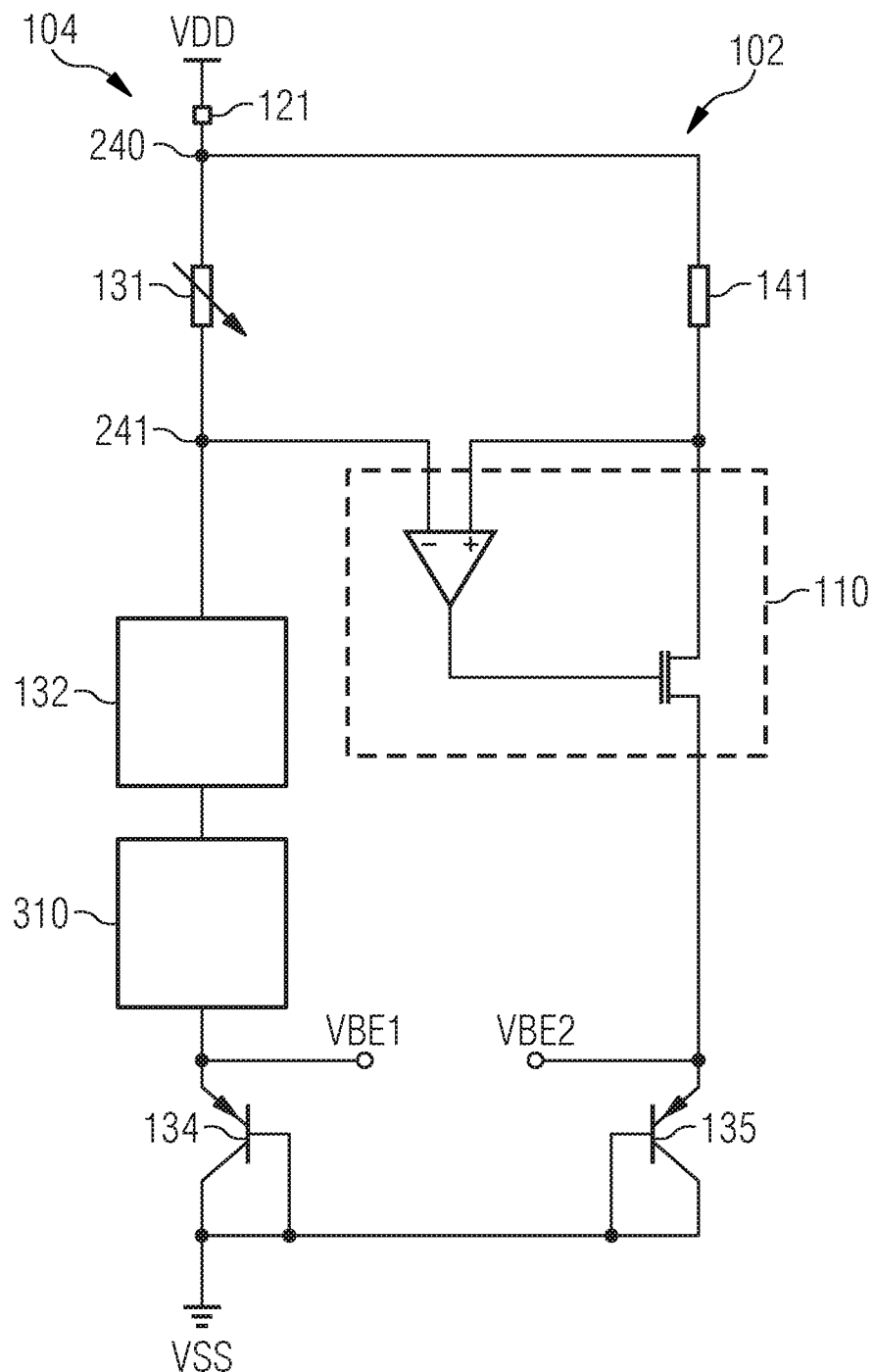
FIG. 3 shows a block diagram of a circuit arrangement according to a second embodiment.

Turning now to FIG. 3, the first circuit branch 104 includes a current limiter 310 which is connected between bipolar transistor 134 and voltage shifter 132. In this case, the current limiter 310 limits the current through the first branch 104 only.

Figure 4:
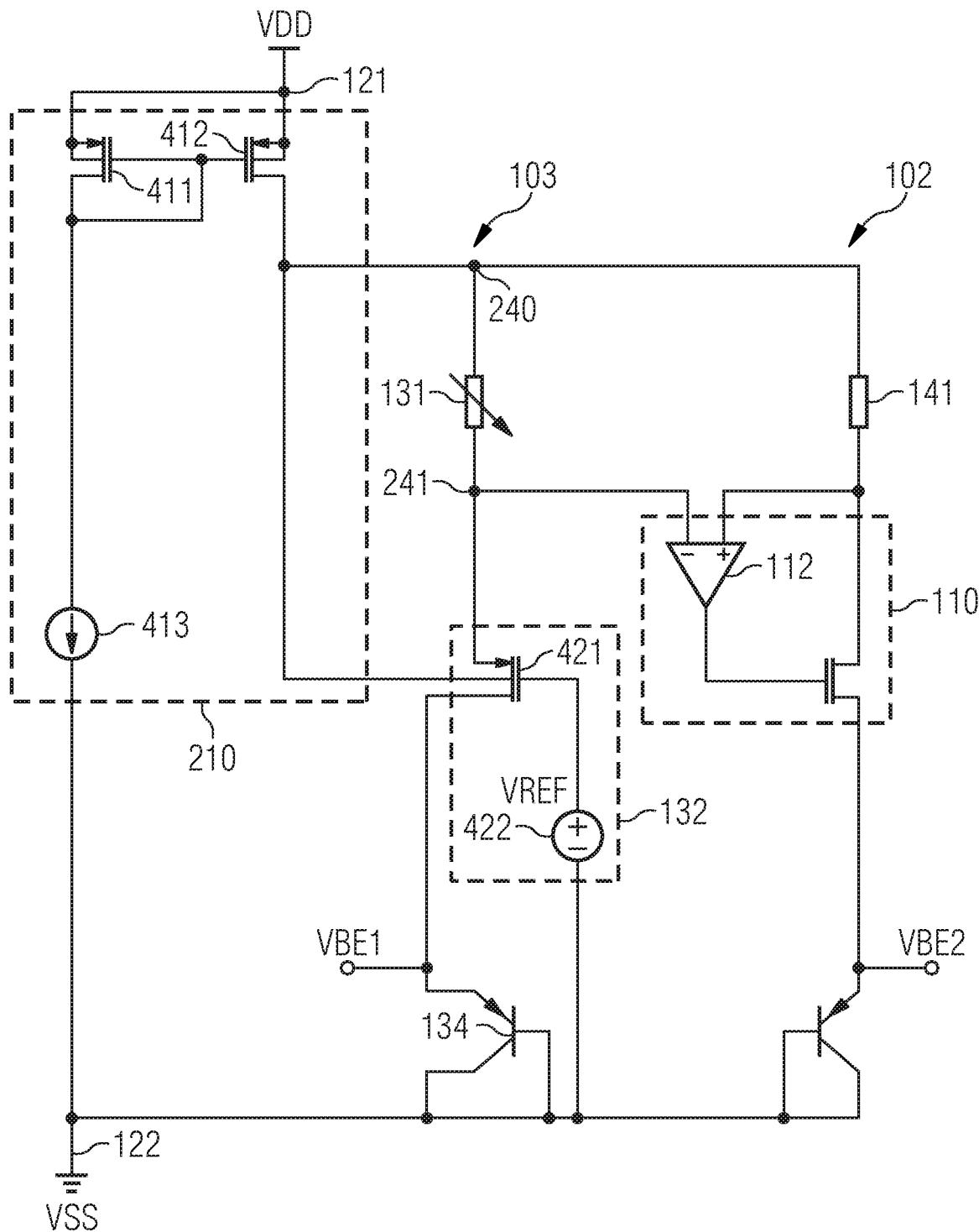
FIG. 4 shows a detailed schematic diagram of a circuit arrangement according to the first embodiment.

Turning now to FIG. 4, a detailed schematic diagram of the circuit of FIG. 2 is illustrated. The voltage shifter 132 comprises a MOS transistor 421 of which the drain-source path is connected between variable resistor 131 and bipolar transistor 134. The gate of transistor 421 is connected to a voltage source 422 referenced to ground potential VSS. The MOS transistor 421 may be a p-channel MOS transistor so that the source terminal of transistor 421 is connected to resistor 131 and the negative input terminal of error amplifier 112. The potential at the source of p-channel MOS transistor 421 is determined by the constant voltage source 422 and the gate source voltage of p-channel MOS transistor 421 that depends on the current flowing through variable resistor 131 so that the source potential is substantially stable. The voltage source 422 may comprise a bandgap circuit well-known to a person skilled in the design of integrated circuits that generates a temperature-independent constant voltage. Voltage source 422 may also include a dynamic component in that it may provide a rough adjustment in response to specific working conditions of the circuit.

The current limiter 210, in this case connected between supply terminal 121 and node 240 at variable resistor 131 includes a current mirror 411, 412. The current mirror comprises a p-channel MOS transistor 411 connected as a MOS diode and a p-channel MOS transistor 412 controlled by the MOS diode 411. The input branch of the current mirror in the form of MOS diode 411 is supplied with a constant current from current source 413 connected between transistor 411 and ground potential terminal 122. Transistor 412 forms the output branch of the current mirror and its drain-source path is connected between supply terminal 121 and node 240. The constant current from current source 413 is input to transistor 411 and mirrored to transistor 412 so that it limits the current through the first branch 103.

Figure 5:
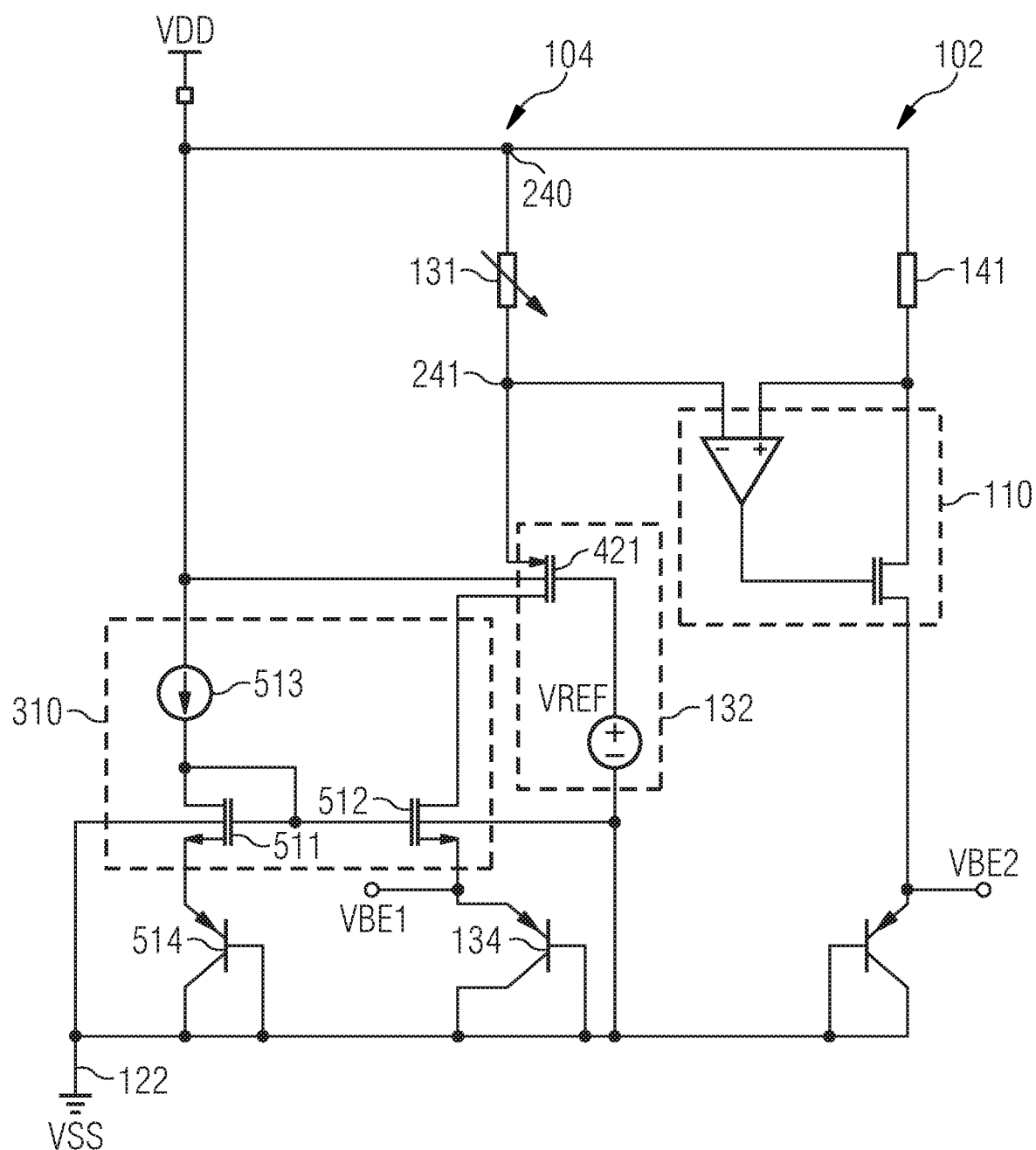
FIG. 5 shows a detailed schematic diagram of a circuit arrangement according to the second embodiment.

Turning now to FIG. 5, a detailed circuit schematic of the circuit of FIG. 3 is illustrated. The voltage shifter 132 is the same as described in connection with FIG. 4. The current limiter block, in this case, is connected between the drain terminal of the p-channel MOS transistor 421 of the voltage shifter 132 and the emitter terminal of bipolar transistor 134. The current limiter 310 includes an input branch including diode-connected n-channel MOS transistor 511 and current source 513. An output branch of the current mirror includes n-channel MOS transistor 512 having a gate connected to transistor 511 and a drain-source path connected between p-channel transistor 421 of voltage shifter 132 and diode-connected bipolar transistor 134. In order to ensure that the source terminals of transistors 511, 512 have the same potential, another diode-connected bipolar transistor 514 is connected between the source terminal of transistor 511 and ground potential 122. The current through constant current source 513 is mirrored into transistor 512, thus limiting the current through the first circuit branch 104.

If the minimum value of the resistance of the variable resistor 131 is sufficiently high, no limitation block 210 or 310 may be required. It should be avoided that the terminals of the variable resistor 131, that is nodes 240, 241, be short-circuited or the variable resistor has a resistance of substantially zero. A short-circuit might incidentally occur when the pins of the variable resistor are accessible from the exterior of the integrated circuit. If this is not a potential fault during the operation of the circuit, the current limitation blocks 210, 310 could be removed, as shown in FIG. 1. In this case, the resistance of the variable resistor 131 should be sufficiently high so that the base resistance of the diode-connected bipolar transistor 134 can be neglected when compared to resistor 131.

The proposed circuits of FIGS. 1 through 5 are also suitable for multiple sensor arrangements that use multiple first branches such as 101, 103, 104 sharing only one single second circuit branch 102. In this case, the regulation 110 and the error amplifier 112 may be time-shared between the multiple first circuit branches.

Considering the operation of the disclosed circuits, the single control loop 110 forces the same voltage drop present at the resistor 131 of variable resistance onto the resistor 141 of fixed resistance. When the resistance of the variable resistor 131 decreases, the voltage drop across resistor 131 decreases. This leads to a decrease of the voltage drop across resistor 141 of fixed resistance by the control loop 110, thereby reducing the current through branch 102. On the other hand, when the resistance of variable resistor 131 increases, the voltage at fixed resistor 141 increases, increasing the current through branch 102. As a consequence, the power consumption is reduced when the resistance of the variable resistor 131 decreases and the sensitivity to leakage currents is decreased when the resistance of variable resistor 131 increases. The voltage drop across the variable resistor 131 is not fixed but increases with increasing resistance of variable resistor 131 and vice versa. The current limiters 210, 310 limit the maximum current flowing through the variable resistor 131, reducing the error due to the base resistance of the diode-connected bipolar resistors 134, 135.

The closed loop 110 is included in the second branch 102, wherein the first branch 101, 103, 104 does not include a closed loop. A capacitive load that may reside on the pins of resistor 131 has almost negligible impact so that no instability is introduced by such a potential capacitive load. During the test of the circuit, the circuit may be accessed by the pins to which the resistor 131 of varying resistance is connected. The negligible capacitive load on these pins improves the testability of the circuit.

Since the voltage drop on variable resistor 131 increases with increasing resistance, the minimum current increases also. As a consequence, the impact of leakage currents is reduced. Since leakage currents highly depend on temperature, the disclosed circuits may operate at a larger temperature range and with a higher resistance.

The current limitation circuits 210, 310 allow to minimize the error due to the base resistance of the bipolar transistors 134, 135. A high accuracy is therefore achieved in a wider resistance range for the variable resistor 131. For example, a measurement error of lower than ±2% may be achieved for a resistance range from 100Ω up to 300 MΩ. The current limitation circuit is effective for low resistances of the variable resistor 131 and does not influence the performance for higher resistances of resistor 131. Since the maximum current flowing through the resistor 131 is limited by the current limiters 210, 310, the circuits are fault-tolerant to short-circuiting the terminals at resistor 131.

Since the maximum current through the circuit is limited and only one control loop is used, power consumption is reduced. The number of devices in the circuit is low so that the occupied semiconductor area in an integrated circuit is small.

Figure 6:
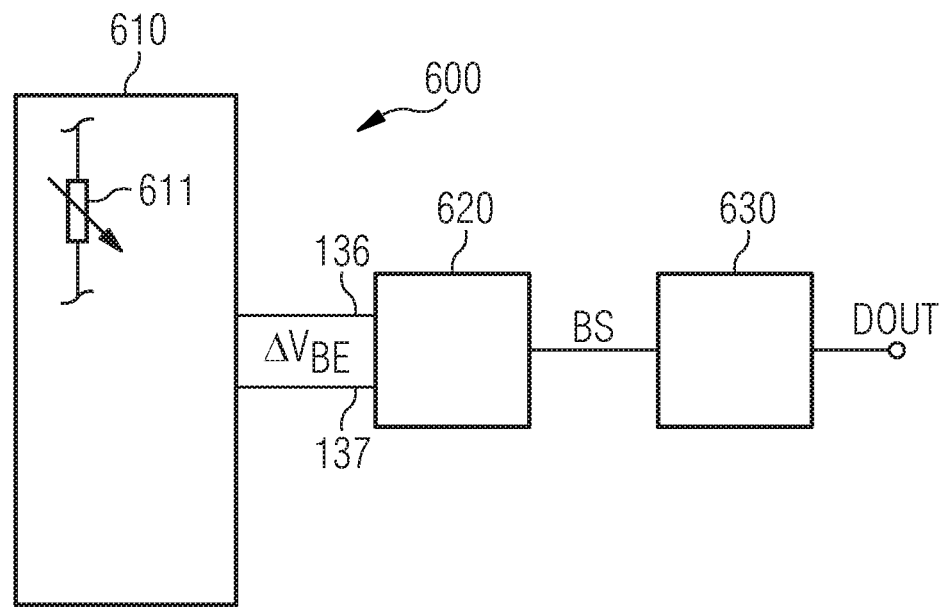
FIG. 6 shows a block diagram of a sensor arrangement.

Turning now to FIG. 6, a sensor arrangement 600 is shown including circuit 610 that generates a differential voltage $\Delta V_{BE}$ at terminals 136, 137. Circuit 610 may be one of the circuits of FIGS. 1 through 5. An analog-to-digital converter (ADC) 620 generates a digital representation from the differential input voltage $\Delta V_{BE}$. The ADC 620 may operate according to the integrating operating scheme, wherein the output signal is a bitstream signal BS that includes a ratio of ones "1" and zeros "0" that represent the analog input value $\Delta V_{BE}$. An ADC using another operating scheme is also possible. The analog frontend circuit 610 of the sensor arrangement includes the variable resistor 611. The resistor 611 may be part of a gas sensor element or a temperature sensor element or another sensor element causing a varying resistance in dependence on an ambient condition.

Figure 7:
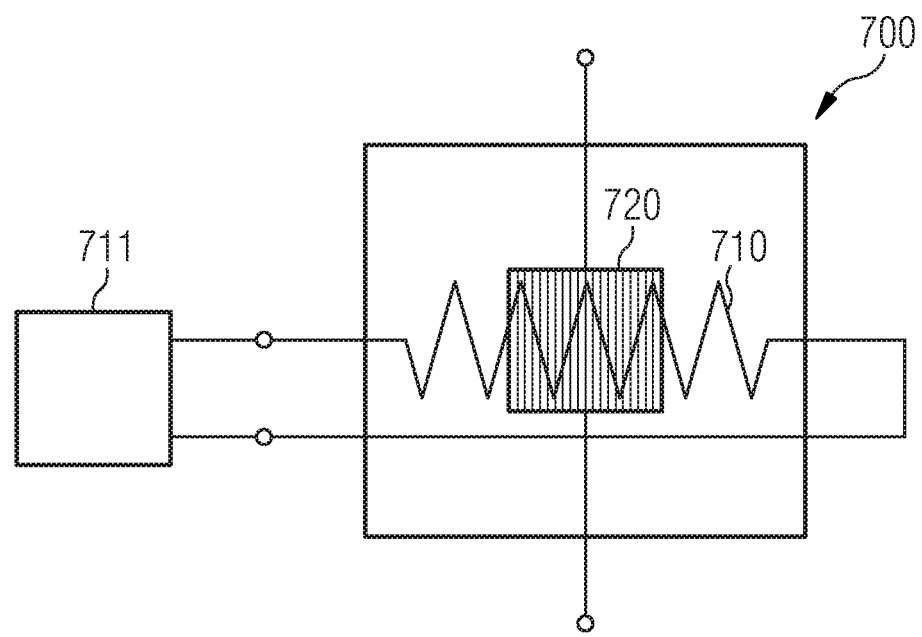
FIG. 7 shows a gas sensor element to be used in the sensor arrangement of FIG. 6.

Turning now to FIG. 7, an example of a gas sensor element 700 is shown. The gas sensor element 700 includes a metal oxide sheet 720 that has a variable resistance in dependence on a reactive gas contacting its surface. The metal oxide sheet 720 requires heating to a defined temperature such as about 300° C. to achieve a suitable working point. Depending on the type of metal oxide and the reactive gas to be sensed, other temperature ranges are also possible. Heating is performed by a resistive heater 710. The heating current is controlled by a control loop 711 that generates the current through resistance heater 710 to maintain the temperature of metal oxide sheet 720 substantially constant.

Metal oxide sheet 720 represents resistor 611 of FIG. 6 in case of a gas sensor arrangement. As an alternative, resistor 611 may be a resistor dependent from temperature, such as a PTC or NTC resistor so that the circuit 600 in FIG. 6 has the function of a temperature sensor.

Turning back to FIG. 6, a calculator 630 performs a calculation to generate a digital value DOUT from the bitstream signal BS wherein the digital signal DOUT is representative of the physical entity that influences the resistance of variable resistor 611 such as the concentration of a gas.

The relation between the variable resistance of resistor 611 and the differential voltage $\Delta V_{BE}$ generated by the analog frontend circuit 610, may be considered as follows. The base emitter voltage of a bipolar diode such as diodes 134, 135 has a logarithmic relation with the emitter current. For example, the voltage VBE1 at terminal 136 of the circuits shown in FIGS. 1 through 5 is determined as:

$$V_{BE1} = \frac{KT}{q} \eta \cdot \ln\left(\frac{I_{SENSOR}}{I_S}\right),$$

wherein $I_{SENSOR}$ represents the current through the sensor resistor 131 of variable resistance, $I_S$ is the saturation current of the bipolar diode 134, K is the Boltzmann constant, T is the temperature, q is the electron charge and η is the ideality factor of the transistor. Correspondingly, the voltage VBE2 at terminal 137 may be determined as:

$$V_{BE2} = \frac{KT}{q} \eta \cdot \ln\left(\frac{I_{REF}}{I_S}\right),$$

wherein $I_{REF}$ is the current through fixed, reference resistor 141. The differential voltage $\Delta V_{BE}$ may be calculated as follows, assuming that η and $I_S$ of the transistors 134, 135 are identical and differences are negligible:

$$\Delta V_{BE} = V_{BE2} - V_{BE1} = \frac{KT}{q} \eta \cdot \left(\ln\left(\frac{I_{REF}}{I_S}\right) - \ln\left(\frac{I_{SENSOR}}{I_S}\right)\right) = \frac{KT}{q} \eta \cdot \ln\left(\frac{I_{REF}}{I_{SENSOR}}\right)$$

Since the voltage drop at resistors 131, 141 is the same caused by the regulation loop 110, $\Delta V_{BE}$ determines as follows:

$$\Delta V_{BE} = \frac{KT}{q} \eta \cdot \ln\left(\frac{\frac{V}{R_{REF}}}{\frac{V}{R_{SENSOR}}}\right) = \frac{KT}{q} \eta \cdot \ln\left(\frac{R_{SENSOR}}{R_{REF}}\right)$$

The varying resistance of resistor 131, $R_{SENSOR}$ can be calculated as follows:

$$R_{SENSOR} = R_{REF} \cdot \exp\left(\frac{\Delta V_{BE}}{\frac{KT}{q} \eta}\right)$$

The differential voltage $\Delta V_{BE}$ is generated by the analog frontend sensor circuit 610, converted to a digital bitstream signal BS by ADC 620 and forwarded to calculator 630. The calculator 630 calculates $R_{SENSOR}$ from the bitstream BS using the above-mentioned formula to generate a digital output value DOUT that represents the value of $R_{SENSOR}$. The relation between $\Delta V_{BE}$ and $R_{SENSOR}$ is logarithmic so that a wide range of resistance values for $R_{SENSOR}$ may be measured. The range of values for $R_{SENSOR}$ is logarithmically compressed when compared to the range of the differential voltage $\Delta V_{BE}$.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirt and substance of the disclosure may occur to the persons skilled in the art, the disclosure should be construed to include everything within the scope of the appended claims.

The invention claimed is:

1. A circuit arrangement comprising:
   a first branch comprising:
      a terminal for a supply potential;
      a resistor of variable resistance;
      a bipolar transistor connected as a diode;
      a terminal for ground potential connected to the bipolar transistor; and
      a voltage shifter;
   a second branch, comprising:
      a resistor of fixed resistance, the resistor of fixed resistance connected to the resistor of the first branch;
      another bipolar transistor connected as a diode, the terminal for ground potential connected to the other bipolar transistor; and
      a transistor;
   a control loop configured to reproduce a voltage drop at the resistor of variable resistance to a voltage drop at the resistor of fixed resistance;
   an amplifier having input terminals connected to the resistors of the first and second branches and an output terminal configured to control the transistor of the second branch; and
   an output terminal connected to the bipolar transistor of the first branch and another output terminal connected to the other bipolar transistor of the second branch, the output terminals configured to supply a differential voltage.

2. The circuit arrangement according to claim 1, further comprising a current limiter disposed in the first branch.

3. The circuit arrangement according to claim 2, wherein the current limiter is connected between the resistor of variable resistance and the terminal for the supply potential, and wherein the resistor of fixed resistance of the second branch is connected to a node between the resistor of variable resistance and the current limiter.

4. The circuit arrangement according to claim 2, wherein the current limiter is connected between the voltage shifter and the bipolar transistor of the first branch, and wherein the resistor of fixed resistance of the second branch is connected to a node between the resistor of variable resistance and the terminal for the supply potential.

5. The circuit arrangement according to claim 2, wherein the current limiter comprises a current mirror having an input branch including a current source and an output branch, the output branch connected between the terminal for the supply potential and the resistor of variable resistance.

6. The circuit arrangement according to claim 2, wherein the current limiter comprises a current mirror having an input branch including a current source and an output branch, the output branch connected between the bipolar transistor of the first branch and the voltage shifter.

7. The circuit arrangement according to claim 5, wherein the input branch of the current mirror comprises a MOS transistor of which gate and drain terminals are connected together and the output branch of the current mirror comprises a drain-source path of another MOS transistor.

8. The circuit arrangement according to claim 1, wherein the voltage shifter comprises a MOS transistor having a drain-source-path comprised in the first branch and having a gate terminal connected to a voltage source.

9. The circuit arrangement according to claim 1, further comprising an analog-to-digital converter connected downstream of the output terminal and the other output terminal, the analog-to-digital converter configured to generate a digital representation of the differential voltage.

10. The circuit arrangement according to claim 9, further comprising a calculator configured to generate a digital value representative of the resistance of the resistor of variable resistance.

11. The circuit arrangement according to claim 10, wherein the calculator is configured to perform a calculation according to the formula:

$$R_{SENSOR} = R_{REF} \cdot \exp\left(\frac{\Delta V_{BE}}{\frac{KT}{q}\eta}\right),$$

wherein $R_{SENSOR}$ represents a resistance value of the resistor of variable resistance, $R_{REF}$ represents a resistance value of the resistor of fixed resistance, $\Delta V_{BE}$ represents the differential voltage, K represents a Boltzmann constant, T represents a temperature, q represents an electron charge and $\eta$ represents an ideality factor at least one of the bipolar transistors.

12. A gas sensor arrangement comprising:
the circuit arrangement according to claim 1,
wherein the resistor of variable resistance comprises a gas sensitive resistor.

13. The gas sensor arrangement according to claim 12, wherein the gas sensitive resistor comprises a metal oxide resistor disposed on a heater.

14. A temperature sensor arrangement comprising:
the circuit arrangement according to claim 1,
wherein the resistor of variable resistance comprises a temperature sensitive resistor having a resistance depending on temperature.

15. A circuit arrangement comprising:
a first branch comprising:
   a terminal for a supply potential;
   a resistor of variable resistance;
   a bipolar transistor connected as a diode;
   a terminal for ground potential connected to the bipolar transistor; and
   a current limiter;
a second branch comprising:
   a resistor of fixed resistance, the resistor of fixed resistance connected to the resistor of the first branch; and
   another bipolar transistor connected as a diode, the terminal for ground potential connected to the other bipolar transistor;
a control loop configured to reproduce a voltage drop at the resistor of variable resistance to a voltage drop at the resistor of fixed resistance; and
an output terminal connected to the bipolar transistor of the first branch and another output terminal connected to the other bipolar transistor of the second branch, the output terminals configured to supply a differential voltage,
wherein the current limiter comprises a current mirror having an input branch including a current source and an output branch, and
wherein the output branch is connected between the terminal for the supply potential and the resistor of variable resistance, or
wherein the output branch is connected between the bipolar transistor of the first branch and a voltage shifter.

16. A circuit arrangement comprising:
a first branch comprising:
   a terminal for a supply potential;
   a resistor of variable resistance;
   a bipolar transistor connected as a diode; and
   a terminal for ground potential connected to the bipolar transistor;
a second branch comprising:
   a resistor of fixed resistance, the resistor of fixed resistance connected to the resistor of the first branch; and
   another bipolar transistor connected as a diode, the terminal for ground potential connected to the other bipolar transistor;
a control loop configured to reproduce a voltage drop at the resistor of variable resistance to a voltage drop at the resistor of fixed resistance;
an output terminal connected to the bipolar transistor of the first branch and another output terminal connected to the other bipolar transistor of the second branch, the output terminals configured to supply a differential voltage;
an analog-to-digital converter connected downstream of the output terminal and the other output terminal, the analog-to-digital converter configured to generate a digital representation of the differential voltage; and a calculator configured to generate a digital value representative of the resistance of the resistor of variable resistance, wherein the calculator performs a calculation according to the formula:

$$R_{SENSOR} = R_{REF} \cdot \exp\left(\frac{\Delta V_{BE}}{\frac{KT}{q}\eta}\right),$$

and wherein RSENSOR represents a resistance value of the resistor of variable resistance, RREF represents a resistance value of the resistor of fixed resistance, $\Delta$VBE represents the differential voltage, K represents a Boltzmann constant, T represents a temperature, q represents an electron charge and $\eta$ represents an ideality factor at least one of the bipolar transistors.

* * * * *